United States Patent
Guschlbauer et al.

(10) Patent No.: US 12,422,491 B2
(45) Date of Patent: Sep. 23, 2025

(54) METHOD AND SYSTEM FOR ANALYZING AN ELECTRICAL STORED ENERGY SOURCE AND ENERGY SUPPLY SYSTEM

(71) Applicant: Fronius International GmbH, Pettenbach (AT)

(72) Inventors: Florian Guschlbauer, Pettenbach (AT); Hannes Heigl, Pettenbach (AT); Johannes Mühlegger, Pettenbach (AT); Dominik Pfaffenbichler, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 0 days.

(21) Appl. No.: 18/604,673

(22) Filed: Mar. 14, 2024

(65) Prior Publication Data
US 2024/0219472 A1 Jul. 4, 2024

Related U.S. Application Data

(63) Continuation of application No. 18/034,173, filed as application No. PCT/EP2022/053873 on Feb. 17, 2022, now abandoned.

(30) Foreign Application Priority Data

Feb. 18, 2021 (EP) .................................... 21157921

(51) Int. Cl.
*G01R 31/3842* (2019.01)
*H02J 7/00* (2006.01)

(52) U.S. Cl.
CPC ........ *G01R 31/3842* (2019.01); *H02J 7/0047* (2013.01)

(58) Field of Classification Search
CPC .................................................. H02J 7/00716
See application file for complete search history.

(56) References Cited

U.S. PATENT DOCUMENTS

| | | | | |
|---|---|---|---|---|
| 5,504,323 A | * | 4/1996 | Heeger | H10K 50/11 257/85 |
| 6,118,275 A | * | 9/2000 | Yoon | G01R 31/367 324/432 |

(Continued)

FOREIGN PATENT DOCUMENTS

| | | |
|---|---|---|
| CN | 101305290 A | 11/2008 |
| CN | 102540084 A | 7/2012 |

(Continued)

OTHER PUBLICATIONS

International Search Report in PCT/EP2022/053873, mailed May 17, 2022.

(Continued)

*Primary Examiner* — Tynese V Mcdaniel
(74) *Attorney, Agent, or Firm* — Collard & Roe, P.C.

(57) ABSTRACT

In a method for analyzing an electrical energy storage device, in particular an accumulator or a battery, the energy storage device is electrically connected to at least one consumer and to at least one electrical energy source in an electrical energy supply system. An electrical energy flow into or out of the energy storage device is directly or indirectly measured using a measuring unit, in particular a smart meter, and at least one energy storage device parameter is iteratively determined on the basis of recorded values of the measured energy flow. The energy flow is expressed by the unit energy per time, and an energy profile of the energy flowing into the energy storage device and extracted from the energy storage device is identified from the energy flow by integrating the energy flow over time. The at least (Continued)

one parameter is determined on the basis of the energy profile.

12 Claims, 4 Drawing Sheets

(56) References Cited

U.S. PATENT DOCUMENTS

| | | | |
|---|---|---|---|
| 9,091,735 B2 | 7/2015 | Wang et al. | |
| 10,608,453 B1* | 3/2020 | Partee | G01R 31/3832 |
| 10,884,475 B1* | 1/2021 | Wang | G06F 1/3296 |
| 11,598,810 B2* | 3/2023 | Cox | G01R 31/367 |
| 11,664,670 B1* | 5/2023 | Devie | H02J 7/007186 |
| | | | 320/132 |
| 11,801,769 B1* | 10/2023 | Ferchau | H01M 10/482 |
| 2004/0232884 A1 | 11/2004 | Vaillancourt et al. | |
| 2014/0184165 A1* | 7/2014 | Takahashi | H01M 10/48 |
| | | | 429/90 |
| 2014/0220451 A1* | 8/2014 | Yu | H01M 10/052 |
| | | | 29/623.5 |
| 2014/0220452 A1* | 8/2014 | Yu | H01M 4/362 |
| | | | 429/303 |
| 2014/0232410 A1* | 8/2014 | Hayashi | G01R 31/3828 |
| | | | 324/426 |
| 2016/0069964 A1* | 3/2016 | Takahashi | G01R 31/392 |
| | | | 324/433 |
| 2017/0104343 A1* | 4/2017 | ElBsat | H02J 3/388 |
| 2018/0031638 A1* | 2/2018 | Wang | G01R 31/374 |
| 2018/0232818 A1* | 8/2018 | Eda | G06N 5/022 |
| 2018/0351363 A1* | 12/2018 | Kasberger | H02J 3/38 |
| 2019/0056451 A1* | 2/2019 | Asghari | H02J 7/00712 |
| 2019/0198833 A1* | 6/2019 | Le | B60L 58/20 |
| 2019/0317150 A1* | 10/2019 | Park | G01R 31/382 |
| 2019/0363547 A1 | 11/2019 | Golan | |
| 2019/0379234 A1* | 12/2019 | Li | H02J 7/0071 |
| 2020/0150186 A1* | 5/2020 | Tsai | G01R 31/374 |
| 2020/0307390 A1* | 10/2020 | Clark | B60L 3/12 |
| 2021/0075226 A1* | 3/2021 | Kogo | H02J 3/32 |
| 2021/0194259 A1* | 6/2021 | Bharadwaj | G05B 13/042 |
| 2021/0242683 A1* | 8/2021 | Kinomura | G01R 22/06 |
| 2021/0354569 A1* | 11/2021 | Ives | B60L 50/60 |
| 2021/0387546 A1* | 12/2021 | Grubwinkler | B60L 58/10 |
| 2022/0077707 A1* | 3/2022 | Yan | H02J 7/0048 |
| 2022/0140618 A1* | 5/2022 | Yoon | H01M 10/486 |
| | | | 320/126 |
| 2022/0143315 A1* | 5/2022 | Stodola | H02J 7/02 |
| 2022/0169138 A1* | 6/2022 | Brombach | B60L 53/65 |
| 2022/0169139 A1* | 6/2022 | Brombach | B60L 53/67 |
| 2022/0283237 A1* | 9/2022 | Kondo | G01R 31/3842 |
| 2022/0376544 A1 | 11/2022 | Daniels | |
| 2022/0381831 A1* | 12/2022 | Ukumori | H02J 13/00002 |
| 2023/0058524 A1* | 2/2023 | Fan | B60L 58/13 |
| 2023/0071975 A1* | 3/2023 | Singer | B60L 58/13 |
| 2023/0093677 A1* | 3/2023 | He | G06F 1/3212 |
| | | | 320/134 |
| 2023/0170727 A1* | 6/2023 | Taniguchi | H01M 10/48 |
| | | | 320/136 |
| 2023/0187954 A1* | 6/2023 | Cronin | H02J 7/345 |
| | | | 307/10.1 |
| 2023/0264596 A1* | 8/2023 | Ko | H01M 10/4207 |
| | | | 320/109 |
| 2023/0275447 A1* | 8/2023 | Zhao | H02J 3/32 |
| | | | 320/134 |
| 2023/0336012 A1* | 10/2023 | Faram | H05B 47/16 |

FOREIGN PATENT DOCUMENTS

| | | |
|---|---|---|
| CN | 110050379 A | 7/2019 |
| CN | 112218057 A | 1/2021 |
| CN | 112269136 A | 1/2021 |
| WO | 2018/104948 A1 | 6/2018 |

OTHER PUBLICATIONS

International Preliminary Report on Patentability in PCT/EP2022/053873, dated Dec. 1, 2022, with English translation mailed Aug. 24, 2023.
European Search Report dated Jul. 28, 2021 in European Application No. 21157921.4 with English translation of relevant parts.
Chinese Office Action in Chinese Patent Application No. 202280007971.1 dated Jan. 11, 2024 with English translation.
Brazilian Office Action in Brazilian Patent Application No. BR1120230006123-7 dated Nov. 7, 2023 with English translation of relevant parts.

* cited by examiner

METHOD AND SYSTEM FOR ANALYZING AN ELECTRICAL STORED ENERGY SOURCE AND ENERGY SUPPLY SYSTEM

CROSS REFERENCE TO RELATED APPLICATIONS

This application is a continuation of and Applicant claims priority under 35 U.S.C. § 120 of U.S. patent application Ser. No. 18/034,173 filed on Apr. 27, 2023, which application is a national stage application under 35 U.S.C. § 371 of PCT Application No. PCT/EP2022/053873 filed on Feb. 17, 2022, which claims priority under 35 U.S.C. § 119 from European Patent Application Ser. No. 21157921.4 filed on Feb. 18, 2021, the disclosures of each of which are hereby incorporated by reference. A certified copy of priority European Patent Application No. 21157921.4 is contained in parent U.S. patent application Ser. No. 18/034,173. The International Application under PCT article 21(2) was not published in English.

BACKGROUND OF THE INVENTION

1. Field of the Invention

The invention relates to a method for analyzing an electrical energy storage device, in particular an accumulator or a battery, wherein the energy storage device is electrically connected in an electrical energy supply system to at least one consumer and at least one electrical energy source.

The invention also relates to an electrical system for analyzing an electrical energy storage device and to an electrical energy supply system having such an analysis system.

2. Description of the Related Art

Electrical energy supply systems, for example for households or commercial companies, generally consist of multiple components, including an electrical energy storage device, an inverter, and a control unit for allocating the load flows ("energy management unit"). In addition, energy sources such as photovoltaic systems can also be integrated into the energy supply system. There are a large number of manufacturers of components for energy supply systems on the market. In most cases, only components from the same manufacturer are used in energy supply systems, as they are coordinated and compatible with each other. In principle, however, it is also possible, and in some cases even desirable, to combine components from different manufacturers together in an energy supply system. However, some components of energy supply system require data exchange with other energy supply system components to function correctly. For example, the control unit should be able to query a current state of charge and other parameters of the energy storage device, so that the control unit can adapt the load flows in the energy supply system to the operating state of the energy storage device and/or the stored energy can be integrated into an existing energy scheme or energy management system. However, many components for energy supply systems only allow data to be exchanged with components from the same manufacturer. Data exchange between components from different manufacturers is often not possible at all, or only with additional effort. However, it would be desirable to be able to combine components from a wide range of different manufacturers in an energy supply system without additional effort and without restricting the functionality. In particular, it would be desirable if other components of an energy supply system could obtain knowledge of the operating state of an energy storage device without having to exchange data with the energy storage device. In this way, an energy storage device from one manufacturer could be easily integrated into an energy supply system with components from another manufacturer without affecting the functioning of the energy supply system.

From the prior art, for example from WO 2018/104948 A1 and US 2019/0056451 A1, energy storage devices and methods for determining parameters of energy storage devices are known.

CN 112269136 A and CN 112218057 A disclose the determination of parameters of energy storage devices using measured physical quantities such as current and voltage. The measured quantities are fed to a mathematical model, from which parameters of the energy storage device are determined.

US 2014/0184165 A1 discloses a circuit arrangement in which the state of charge of a battery can be determined by means of a charge counter.

SUMMARY OF THE INVENTION

In the light of the above comments, it is the object of the present invention to mitigate or even eliminate the disadvantages of the prior art. In particular, the object of the present invention is to provide a method and a system for analyzing an energy storage device, with which at least one parameter of an energy storage device integrated in an energy supply system can be determined without data exchange with the energy storage device being required.

This object is achieved firstly by a method according to one aspect of the invention.

According to the invention, in a method of the type mentioned above, it is provided that an energy flow into or out of the energy storage device is measured and that at least one parameter of the energy storage device is determined iteratively on the basis of recorded values of the measured energy flow. Advantageously, the method according to the invention no longer requires data exchange with the energy storage device or the control unit thereof, for example, to obtain information about the state of charge or the usable capacity of the energy storage device. The value of the at least one parameter determined by the method may be unknown prior to the start of the method. To determine the at least one parameter of the energy storage device, the electrical energy flow into or out of the energy storage device is measured, stored and evaluated. At least the measured values of current and voltage can be used as a basis for measuring the energy flow. The energy flow can be measured, for example, by one or more wattmeters or one or more smart meters. The energy flow is a power variable and is expressed in the unit of energy per time, in particular Watts or Joules per second. On the basis of the energy flow into or out of the energy storage device, at least one parameter of the energy storage device can be determined, which in particular was previously unknown or which for the reasons explained above was not accessible. By knowing the at least one parameter, the energy storage device can be controlled more efficiently and, for example, better integrated into an existing energy scheme. The application of the method is particularly advantageous if a third-party energy storage device of one manufacturer is to be integrated into an energy supply system with components of another manufacturer. As mentioned above, in such cases, access to the parameters of the energy storage device is usually not possible, as many energy storage devices do not allow data exchange with components from other manufacturers. The measured energy flow represents—depending on the direction—an instantaneous record of the power consumption or the power output of the energy storage device at any time. Preferably, the at least one parameter of the energy storage device can be determined and continuously updated by constant measurement of the energy flow and by taking into account previously measured values of the energy flow. In one embodiment, in a learning phase at the beginning of the application of the method, before the at least one parameter is determined or definitively determined, the measured values of the energy flow over a period of time, for example, at least one or more hours, can be recorded and stored. In this learning phase, a connected load can also be activated or deactivated to "stimulate" the energy storage device to charge or discharge. The at least one parameter can then be determined after the learning phase on the basis of the stored values. Of course, the at least one parameter can also be continuously adjusted or newly determined after completion of the learning phase, on the basis of further measured values of the energy flow. The constant determination of the energy flow can be carried out in a time-discrete manner, i.e. at regular or even irregular intervals. From the measured values of the energy flow, a time profile, also called an energy profile, of the energy flowing into the energy storage device and extracted from the energy storage device can be determined. The energy profile can be determined from the energy flow, in particular by integrating it over time. The energy profile is preferably stored so that a corresponding value of the energy is available at any time. In one embodiment, the at least one parameter can be determined on the basis of this temporal profile. The at least one parameter can be, for example, an energy currently contained in the energy storage device, a current minimum available capacity of the energy storage device, in particular a current minimum available charging or discharging capacity, a usable capacity of the energy storage device, a charging state of the energy storage device, an internal consumption of the energy storage device, a charging and discharging loss of the energy storage device, an efficiency level, a energy storage device model parameter or a parameter of a charging or discharging characteristic of the energy storage device. Charging or discharging characteristics include, but are not limited to, charging power and discharging power.

Of course, several of the parameters mentioned can also be determined with the method according to the invention. A current minimum available capacity of the energy storage device is a quantity of energy that is at least available for the purposes of charging or discharging the energy storage device at a certain point in time. The minimum available capacity, therefore, depending on the application, can be a quantity of energy that can at least be loaded into or extracted from the energy storage device. The minimum available capacity can therefore be a charging capacity or a discharging capacity of the energy storage device. The usable capacity of a energy storage device is the maximum quantity of energy that can also actually be used for charging and discharging purposes. The usable capacity is usually lower than the nominal capacity of the energy storage device since the whole nominal capacity of a energy storage device cannot be used. The usable capacity is equal to the sum of the charging capacity and discharging capacity. The state of charge of the energy storage device, also known as SoC, can be specified, for example, as a percentage and represents the quantity of energy currently contained in the energy storage device in relation to its usable capacity. The at least one parameter that is determined does not have to be constant over time, but can also vary, such as the state of charge. The at least one parameter is therefore determined iteratively. Iteratively means that the at least one parameter is continuously redetermined or updated on the basis of previously recorded and newly measured values of the energy flow. For example, it may be provided that at least one parameter is adjusted or redetermined after each new measurement of the energy flow. As mentioned above, the measurements can be carried out at discrete time intervals, for example every 1 to 10 seconds. Of course, shorter or longer intervals are also possible. The iterative determination of the at least one parameter means that the value of the parameter determined by the method can be approximated to the actual value of the parameter over time. The energy storage device may consist of multiple cells or energy storage sub-devices and may also have an integrated inverter, for example.

In a preferred embodiment of the invention, it is provided that on the basis of recorded values of the energy flow a usable capacity of the energy storage device is determined as a parameter. Preferably, a temporal profile of the energy flowing into the energy storage device and extracted from the energy storage device is determined from the measured values of the energy flow, for example by integrating the energy flow over time. As already explained above, this temporal profile can also be referred to as an energy profile. A preferably global minimum and a preferably global maximum can be determined from the energy profile. By forming a difference between the preferably global maximum and the preferably global minimum, the usable capacity of the energy storage device can be determined. The maxima and minima of the energy profile can change over time. Accordingly, these can also be determined iteratively and the usable capacity of the energy storage device can be adjusted accordingly or re-determined. The longer the method is used, the higher the probability that the global maxima and minima will no longer change and that the calculated usable capacity will approximate to the actual usable capacity. For this reason, as already mentioned above, a learning phase may preferably be provided, in which the energy flow into or out of the energy storage device is recorded. For example, the learning phase can be performed for a specified period of time. The learning phase can also last until the global maximum and the global minimum of the energy profile no longer change for a predefined observation period. The global maximum and global minimum are continuously updated during the learning phase. Initially, the (single) maximum is equal to the global maximum. This is stored and if a new maximum exceeds the global maximum, the global maximum is redefined according to this new value. The same applies to the global minimum. At the end of the learning phase, the global maximum and the global minimum, and thus the usable capacity, are determined. However, the method itself can be continued after the learning phase has been completed, as other parameters, such as the state of charge of the energy storage device, may change. These changes are captured by the method.

In a further embodiment of the invention, on the basis of recorded values of the energy flow an energy currently contained in the energy storage device is determined as a parameter. The energy currently contained in the energy storage device, like the energy profile in general, can be determined, for example, by temporal integration of the measured energy flow into or out of the energy storage device. It goes without saying that the integration requires an initial value, which can initially be zero, for example. In simple terms, in this embodiment it may be provided that the energy profile, i.e. the temporal profile of the energy flowing into the energy storage device and extracted from the energy storage device, is determined. A temporal endpoint of this energy profile represents the energy currently available in the energy storage device, the endpoint being constantly changed and progressing over time due to newly measured values of the energy flow.

In a preferred embodiment of the invention, at least a usable capacity and an energy currently contained in the energy storage device are determined.

In one embodiment of the invention, it may be provided that on the basis of the energy currently contained in the energy storage device and the usable capacity of the energy storage device, a current state of charge of the energy storage device is determined. The current state of charge of the energy storage device can be determined by expressing the energy currently contained in the energy storage device as a proportion of the usable capacity.

In a further embodiment of the invention, on the basis of recorded values of the energy flow a current minimum available capacity of the energy storage device is determined as a parameter. The minimum available capacity can be a minimum available charging capacity or a minimum available discharging capacity. From the energy profile described above, a preferably global minimum and/or a preferably global maximum can be determined. A difference between the preferably global minimum and the energy currently contained in the energy storage device represents a current minimum available discharging capacity of the energy storage device. A difference between the preferably global maximum and the energy currently contained in the energy storage device represents a current minimum available charging capacity of the energy storage device. A discharging capacity designates a quantity of energy that can be extracted from the energy storage device. A charging capacity designates a quantity of energy that can be loaded into the energy storage device.

Preferably, in order to measure the energy flow into or out of the energy storage device, an electrical current into and out of the energy storage device and an electrical voltage at the energy storage device is measured. The product of measured current and measured voltage at a given point in time results in the energy flow at that point in time. The direction of the current determines the direction of the energy flow.

In one embodiment, it is provided that the at least one energy source, for example a photovoltaic system or a supply network, feeds electrical energy into the energy storage device as a function of the at least one parameter. As stated above, the at least one parameter may be, for example, a state of charge or a current minimum available charging or discharging capacity of the energy storage device. For example, if sufficient charging capacity is available, the energy source can load electrical energy into the energy storage device. A plurality of energy sources can also be provided.

Preferably, the at least one energy source is an electrical supply network, in particular an alternating current network, or a photovoltaic system.

In order to analyze the stored energy even more comprehensively, an energy flow into or out of the at least one energy source can be measured and used, for example, to determine the at least one parameter of the energy storage device. The measurement on the energy source can be carried out by an additional measuring unit, for example a smart meter. In particular, it may be provided for the energy flow to be measured at an infeed point of the energy source, in particular at an infeed point of the supply network or the photovoltaic system. If multiple energy sources are present, it may be provided that the energy flow into all or from all energy sources is measured. In this embodiment, for example, it is possible to determine the conditions under which the energy storage device becomes active and thereby absorbs or releases energy. A possible condition under which the energy storage device absorbs energy may be met, for example, if at the infeed point or at the infeed points of the energy source(s) an energy surplus or power surplus is present, which is absorbed by the energy storage device. Thus, the point in time at which all known components of the system are supplied and there is surplus energy available for feeding into the grid is detected. If this surplus energy is now measured by the additional measuring unit, the energy storage device is active and absorbs the surplus energy from this point in time onwards. Knowledge of the conditions under which the energy storage device becomes active enables or facilitates the subsequent control of the energy storage device.

The above-mentioned object is further achieved by an electrical system for analyzing an electrical energy storage device according to another aspect of the invention. The analysis system comprises:
- at least one measuring unit, in particular a smart meter, for detecting an energy flow into or out of an electrical energy storage device, in particular an accumulator or a battery;
- an evaluation unit which is configured to determine at least one parameter of the energy storage device on the basis of values of the measured energy flow.

The analysis system is designed to carry out the method described above when it is integrated into an electrical energy supply system having an electrical energy storage device. With regard to the advantages and functioning of the analysis system, reference is made to the above statements relating to the method according to the invention. All the features of the method can also be transferred to the analysis system in an appropriate manner. The analysis system can be a distributed system. The at least one measuring unit and the evaluation unit can thus be spatially separated and communicate with each other, for example, via a server. In any case, a data exchange can take place between the at least one measuring unit and evaluation unit. The at least one measuring unit may comprise measuring sensors for detecting current and voltage. The at least one measuring unit is designed to directly or indirectly detect the energy flow into or out of the energy storage device.

The invention relates to an electrical energy supply system comprising:
- at least one electrical consumer;
- at least one electrical energy source;
- at least one electrical energy storage device; and
- an electrical analysis system of the type described above, wherein the electrical consumer, the energy source, the energy storage device and the at least one measuring unit of the analysis system are electrically connected to one another.

The invention can also be described using the following embodiments, wherein the features and definitions described above can be transferred to the described embodiments:

Embodiment 1: A method for analyzing an electrical energy storage device, in particular an accumulator or a battery, wherein the energy storage device is electrically connected to at least one consumer and at least one electrical energy source in an electrical energy supply system, wherein an electrical energy flow into or out of the energy storage device is measured and at least one parameter of the energy storage device is determined iteratively on the basis of recorded values of the measured energy flow.

Embodiment 2: Method according to embodiment 1, wherein on the basis of recorded values of the energy flow a usable capacity of the energy storage device is determined as a parameter.

Embodiment 3: Method according to embodiment 1 or 2, wherein on the basis of recorded values of the energy flow, an energy currently contained in the energy storage device is determined as a parameter.

Embodiment 4: Method according to embodiment 3 with reference to embodiment 2, wherein on the basis of the energy currently contained in the energy storage device and the usable capacity of the energy storage device, a current state of charge of the energy storage device is determined as a parameter.

Embodiment 5: Method according to any one of the embodiments 1 to 4, wherein on the basis of recorded values of the energy flow, a current minimum available capacity, in particular a minimum available charging capacity or a minimum available discharging capacity, of the energy storage device is determined as a parameter.

Embodiment 6: Method according to any one of the embodiments 1 to 5, wherein in order to measure the energy flow into or out of the energy storage device, an electrical current into and out of the energy storage device and an electrical voltage at the energy storage device is measured.

Embodiment 7: Method according to any one of the embodiments 1 to 6, wherein the at least one energy source feeds electrical energy into the energy storage device as a function of the at least one parameter.

Embodiment 8: Method according to any one of the embodiments 1 to 7, wherein the at least one energy source is an electrical supply network, in particular an alternating current network, or a photovoltaic system.

Embodiment 9: Method according to any one of the embodiments 1 to 8, wherein also an energy flow into or out of the at least one energy source is measured and used, for example, to determine the at least one parameter of the energy storage device.

Embodiment 10: Electrical system for analyzing an electrical energy storage device, comprising:
at least one measuring unit, in particular a smart meter, for detecting an energy flow into or out of an electrical energy storage device, in particular an accumulator or a battery;
an evaluation unit which is configured to determine at least one parameter of the energy storage device on the basis of values of the measured energy flow.

Embodiment 11: Energy supply system, comprising:
at least one electrical consumer;
at least one electrical energy source;
at least one electrical energy storage device; and
an electrical analysis system according to embodiment 10, wherein the electrical consumer, the energy source, the energy storage device and the at least one measuring unit of the analysis system are electrically connected to one another and the measuring unit is configured to detect the energy flow into and/or out of the energy storage device.

BRIEF DESCRIPTION OF THE DRAWINGS

In the following, the invention is described by reference to figures, but to which they are not intended to be limited. In the drawings.

DETAILED DESCRIPTION OF PREFERRED EMBODIMENTS

Figure 1A:
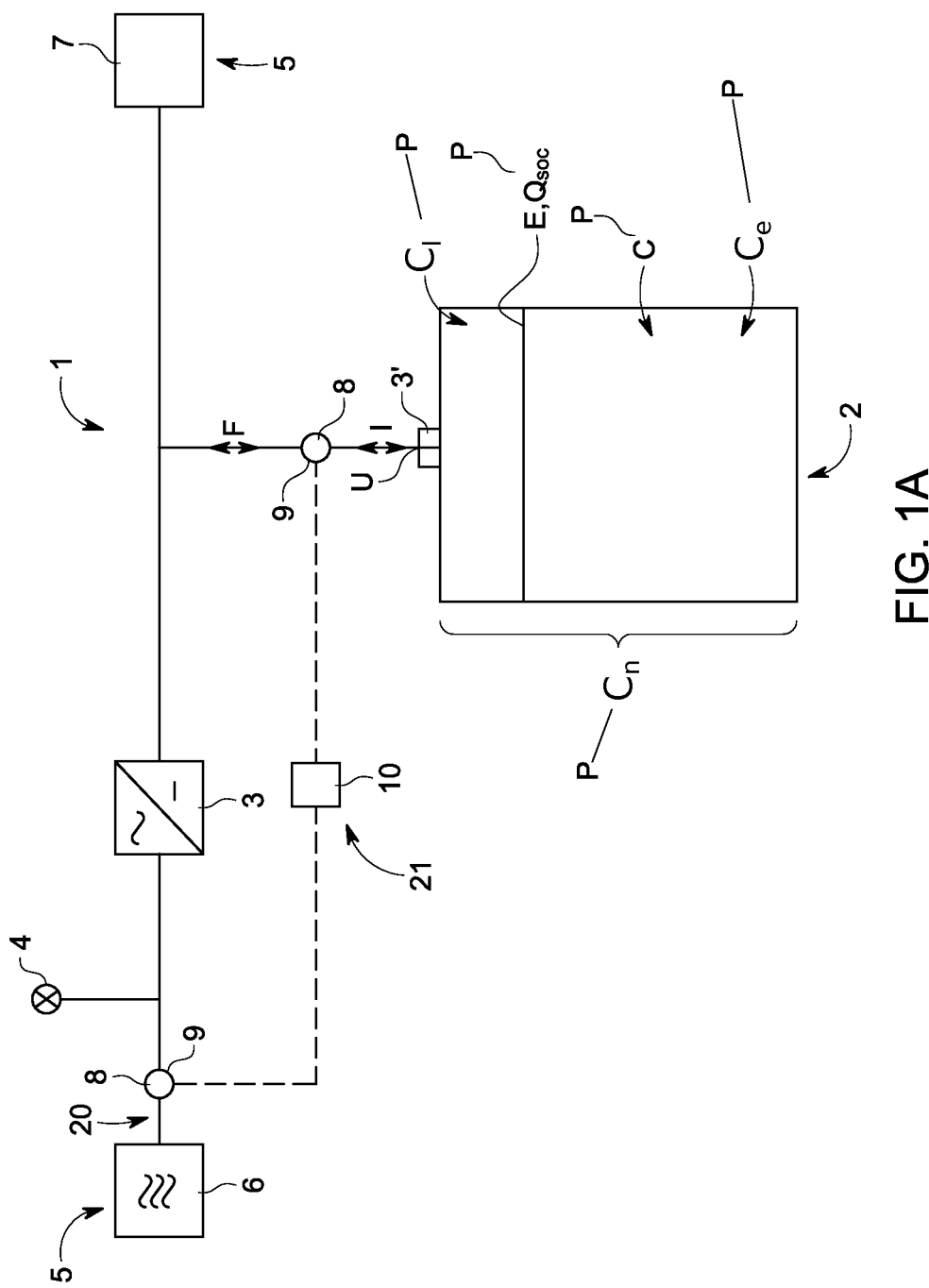
FIG. 1A and FIG. 1B, each schematically, show an electrical energy supply system having an electrical energy storage device.
Figure 1B:
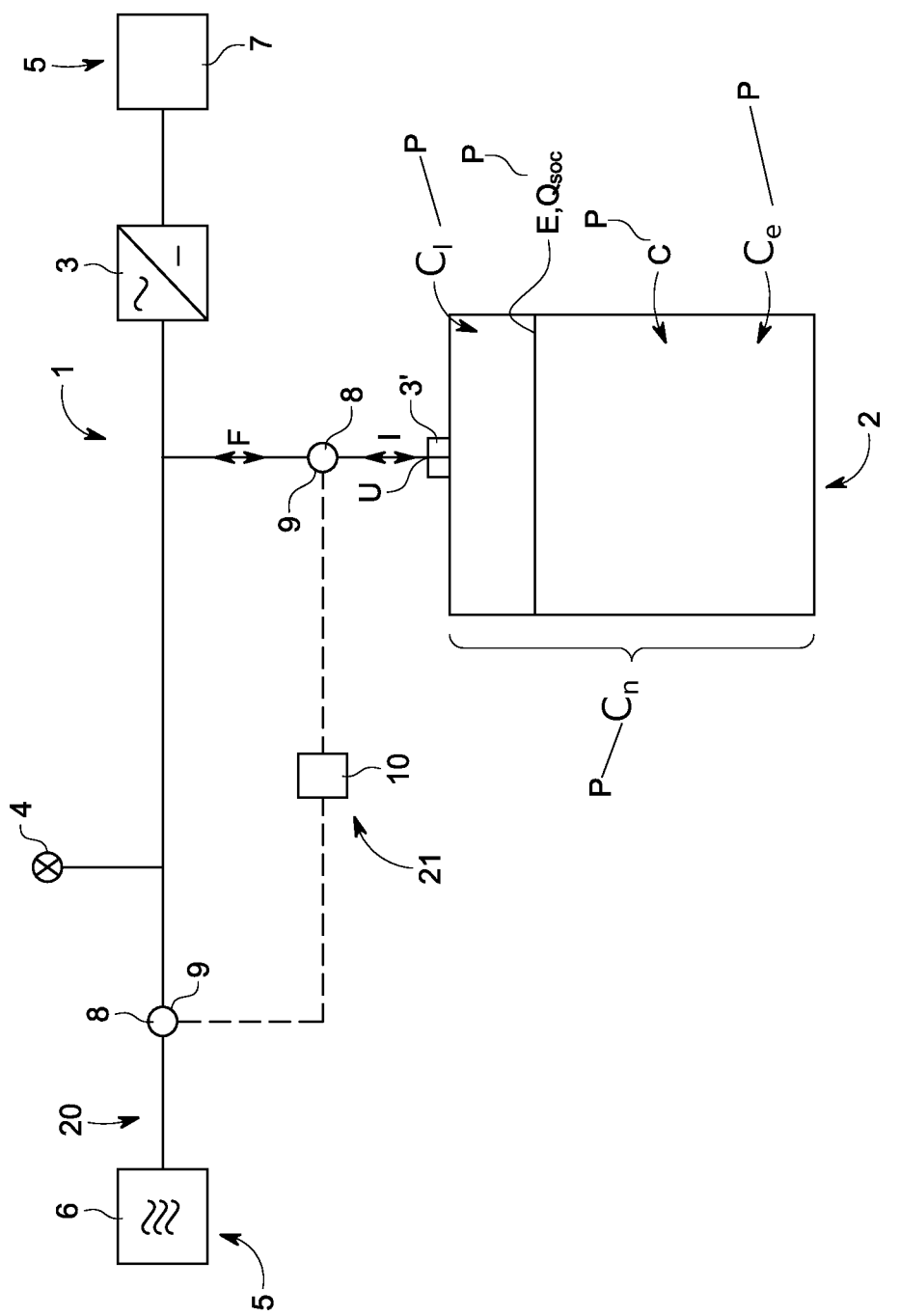

FIG. 1A and FIG. 1B show, by way of example, different variants of an energy supply system 1 having an electrical energy storage device 2, an inverter 3, a consumer 4, a first energy source 5 in the form of a three-phase alternating current network 6, and a second energy source 5 in the form of a photovoltaic system 7, which are electrically connected to each other in an appropriate manner. The energy storage device 2 can, for example, have a controller, a management system and a converter unit 3' within its housing.

Using at least one measuring unit 8, in particular a smart meter 9, an electric energy flow F into or out of the electric energy storage device 2 can be measured directly or indirectly. For this purpose, a voltage U and/or a current I are measured by the at least one measuring unit 8. From this, the electrical power or the energy flow F into or out of the energy storage device 2 can then be determined. In some cases, only the current I may be measured if the voltage U can be assumed to be constant. The product of the voltage U and current I gives the energy flow F or the power or a quantity representative thereof, wherein the direction of the current I specifies the direction of the energy flow F. In the illustrated exemplary embodiment, two measuring units 8 are provided. A measuring unit 8 is provided in the vicinity of the energy storage device 2 and a further measuring unit 8 is provided at an infeed point 20. However, the method only requires at least one measuring unit 8, with which the energy flow F into or out of the energy storage device 2 can be determined. More measuring units 8 than those shown can also be provided. No consumers are arranged between the measuring unit 8 in the vicinity of the energy storage device 2 and the energy storage device 2. The measuring unit 8 in the vicinity of the energy storage device 2 can also be integrated into the energy storage device 2 or its housing. The measured values of the energy flow F can be provided by the measuring units 8 to an evaluation unit 10, for example via radio or wired link, optionally via a server. The evaluation unit 10 can be spatially separated from the measuring units 8. At least one measuring unit 8 and the evaluation unit 10 form a minimum configuration of an analysis system 21 for carrying out the method according to the invention.

The measured values of the measuring unit 8 at the infeed point 20 can be transferred to the evaluation unit 10 in the same way as the measured values measured by the measuring unit 8 in the vicinity of the energy storage device 2, and are taken into account in the method according to the invention. With the aid of the measuring unit 8 at the infeed point 20, for example, it is possible to determine the conditions under which the energy storage device 2 at the infeed point 20 becomes active, i.e. absorbs or emits energy E. For example, this may be the case if there is surplus energy available at the infeed point 20. With this knowledge, the energy supply system 1 can be controlled more efficiently or the energy storage device 2 can be integrated into an energy management scheme.

FIG. 1A and FIG. 1B each show different variants of an energy supply system 1. In FIG. 1A, the energy storage device 2 is connected on the DC side of the inverter 3. Accordingly, the energy storage device 2 is charged or discharged with DC (Direct Current). In order to compensate for different voltage levels, a converter unit 3', for example a bidirectional DC-DC converter, is preferably integrated in the energy storage device 2 or in its housing.

FIG. 1B shows an alternative configuration of an energy supply system 1, wherein the energy storage device 2 is connected on AC side of the inverter 3. The following only deals with the differences with respect to the wiring diagram of FIG. 1A. The energy storage device 2 or its housing can contain an integrated converter unit 3' in the form of an inverter to charge or discharge the energy storage device 2 with DC current. The measuring unit 8 in front of the energy storage device 2 can be omitted if the converter unit 3' provides an interface that supplies the measured values of voltage U and current I.

In order to control the load flows into and out of the energy storage device 2 or to be able to integrate the energy storage device 2 optimally into an energy management scheme, knowledge of its operating state is required. As a rule, parameters P of the energy storage device 2, such as a usable capacity $C_n$ or a charge state $Q_{SOC}$ are provided by the energy storage device 2 via a data interface. However, data exchange is usually only possible between components from the same manufacturer. If, however, the energy storage device 2 comes from a different manufacturer than the other components of the energy supply system 1, then the parameters P of the energy storage device 2 can be read only with difficulty or not at all. To be able to investigate the operating state of a energy storage device 2 of a third-party manufacturer, it is provided according to the invention that the energy flow into or out of the energy storage device 2 is measured and that at least one parameter P of the energy storage device 2 is determined iteratively on the basis of recorded values of the measured energy flow F. Iteratively means that the at least one parameter is P continuously redetermined or updated on the basis of previously recorded and newly measured values of the energy flow F. Multiple parameters P can also be determined. Examples of parameters P are the charge state $Q_{soc}$, a usable capacity $C_n$ or a minimum available capacity C of the energy storage device 2. Another example of the parameter P is the efficiency. The minimum available capacity C can be a current minimum available charging capacity $C_l$ or a current minimum available discharging capacity $C_e$. In FIGS. 1A and 1B, for the sake of clarity, only $C_e$ is shown as the minimum available capacity C. But $C_l$ also forms a minimum available capacity C. The sum of the current minimum available charging capacity $C_l$ and the current minimum available discharging capacity $C_e$ results in the usable capacity $C_n$. A discharging capacity $C_e$ designates a quantity of energy that can be extracted from the energy storage device 2. A charging capacity $C_l$ designates a quantity of energy that can be loaded into the energy storage device 2. The following describes how the P parameters of the energy storage device 2 can be determined.

Figure 2:
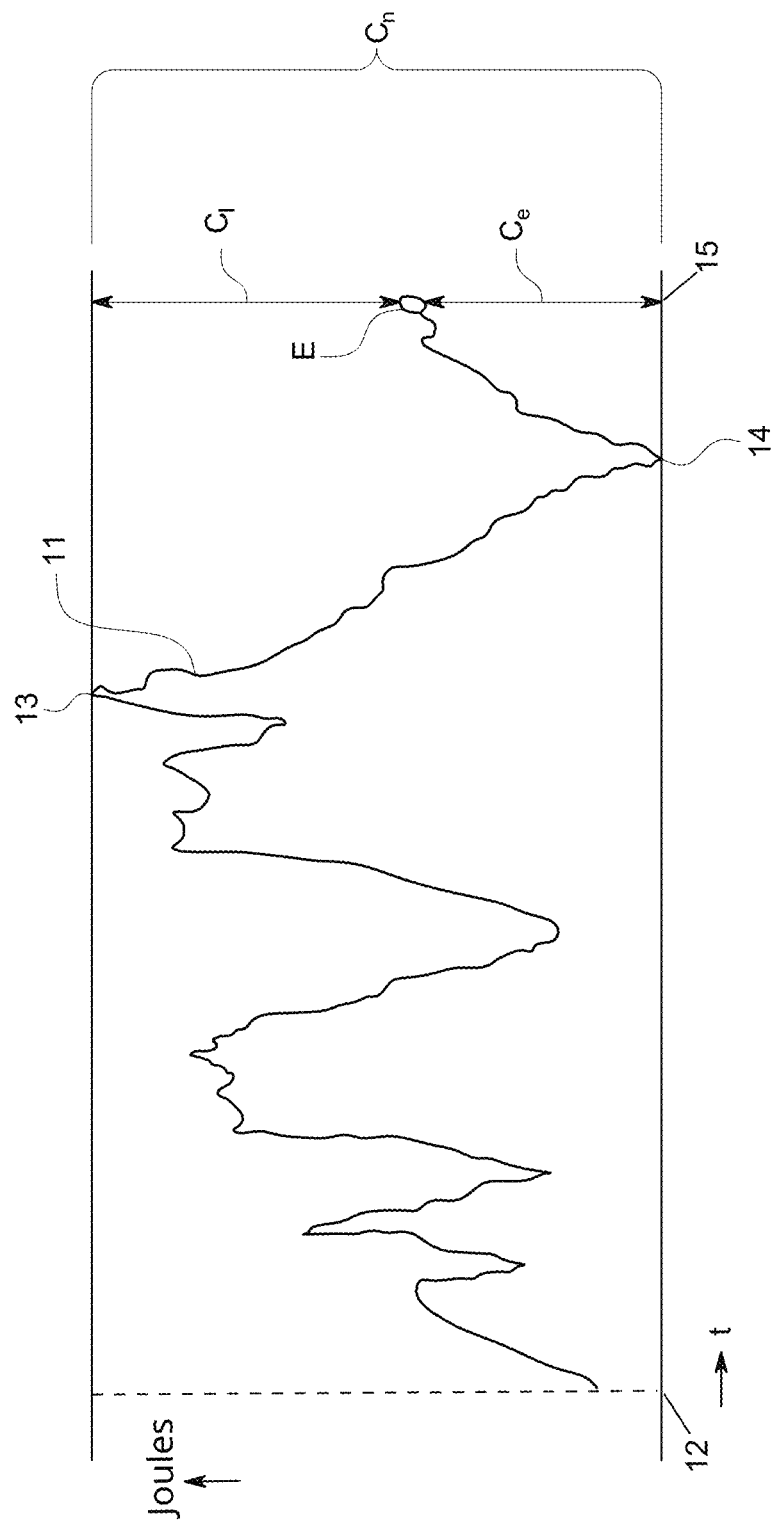
FIG. 2 shows a schematic temporal profile of the energy contained in the energy storage device.

From the measured values of the energy flow F, using integration over time a temporal profile of the energy E flowing into the energy storage device and 2 extracted from the energy storage device 2 can be determined. The profile of the energy E can also be referred to as a temporal energy profile 11. The energy profile 11 maps the energy E currently contained in the energy storage device 2 at any given time. An exemplary energy profile 11 is shown in FIG. 2. It shows that energy E is extracted from and fed into the energy storage device unit 2 over time. The measurement of the energy flow F is carried out continuously and in a time-discrete manner. If the measurement detects activity (i.e. the energy storage device 2 is active) in the energy flow F, the recording or transmission of the data to the evaluation unit 10 starts at a start time 12. Then, for example, during an initial learning phase, the energy flow F is measured and recorded. Further measurements of the energy flow F can be used to continue the energy profile 11. The following parameters P can be determined on the basis of the energy flow F or from the energy profile 11:

From the global maximum 13 and the global minimum 14 of the energy profile 11, a current usable capacity $C_n$ of the energy storage device 2 can be determined by calculating the difference. By measuring the energy flow F over a longer period of time, the current usable capacity $C_n$ can be approximated to the actual usable capacity of the energy storage device 2.

From the global maximum 13 and the global minimum 14, the efficiency of the energy supply system 1 and/or of the energy storage device 2 can also be determined, based on the data from the measuring unit 8. Thus, in the first step, a first value for the efficiency is obtained. Temporal analyses can be used to discover whether a new global maximum 13 or global minimum 14 is constantly emerging. The temporal analysis can be carried out, for example, by approximation to a straight line. If the analysis of the linear trend, i.e. the straight line, does not result in a slope, then the efficiency has been correctly determined. If the trend is a slope in a positive or negative direction, the efficiency has not been determined correctly. The efficiency is corrected. If a new global minimum 14 is constantly emerging, then the previous value for the efficiency was too low, in other words the battery is more efficient than initially assumed. The value for the efficiency is corrected to this effect, i.e. increased, so that the value is again between 0% and 100%. However, if a new global maximum 13 is constantly reached, this indicates that the previous value of the efficiency was too high, the battery is in fact more inefficient and more energy is being lost during storage until the battery is actually full. The efficiency must be adjusted downwards in this case, so that the value is again between 0% and 100%.

In one embodiment, the efficiency can also be determined if it is known that the external battery, i.e. the energy storage device 2, can be controlled by a surplus at the infeed point (external battery regulates to zero infeed). Then, through deliberate surplus generation and load generation (setting on a known 2nd domestic storage device by means of energy management) the external battery, i.e. the energy storage device 2, can be brought to full charge and discharge. From this, an efficiency can then be calculated as a parameter.

FIG. 2 shows only an extract of an energy profile 11. By recording further measured values of the energy flow F, the energy profile 11 can be continued as already mentioned. Under certain circumstances, a new global maximum 13 or global minimum 14 of the energy profile 11 may occur. By the iterative determination of the parameters P according to the invention, an eventual change in the global maximum 13 or the global minimum 14 is detected and the current usable capacity $C_n$ is adjusted or redetermined.

The energy profile 11 represents the energy E contained in the energy storage device 2 at any given time. In order to determine the energy E currently contained in the energy storage device 2, i.e. at the current end point 15, the end point 15 and the global minimum 14 of the energy profile 11 can be used.

A minimum available capacity C can also be determined from the energy profile 11. The minimum available capacity C can be a current minimum available charging capacity $C_l$ or a current minimum available discharging capacity $C_e$. By calculating a difference between the energy E currently contained in the energy storage device 2 and the global minimum 14, the current minimum available discharging capacity $C_e$ of the energy storage device 2 can be determined. The minimum available discharging capacity $C_e$ is a minimum quantity of energy that can be extracted from the energy storage device 2. The minimum available discharging capacity $C_e$ can correspond to the energy E. However, if the entire energy E cannot or is not intended to be extracted from the energy storage device 2, the energy E and the minimum available discharging capacity $C_e$ can differ from each other. By calculating a difference between the energy E currently contained in the energy storage device 2 and the global maximum 13, a current minimum available charging capacity $C_l$ of the energy storage device 2 can be determined. A charging capacity $C_l$ is a quantity of energy that can be loaded into the energy storage device 2.

On the basis of the energy E currently contained in the energy storage device 2 and the usable capacity $C_n$ of the energy storage device 2, a current state of charge $Q_{SOC}$ of the energy storage device 2 is determined as a parameter P. To determine the current state of charge $Q_{SOC}$, a ratio of the energy E currently contained in the energy storage device 2 to the usable capacity $C_n$ can be formed and this ratio can be expressed as a percentage, for example.

The usable capacity $C_n$ of the energy storage device 2 can also include an energy reserve for emergency power operation. In other words, the energy reserve is part of the minimum available discharging capacity $C_e$, which can be used in emergency power operation.

Figure 3:
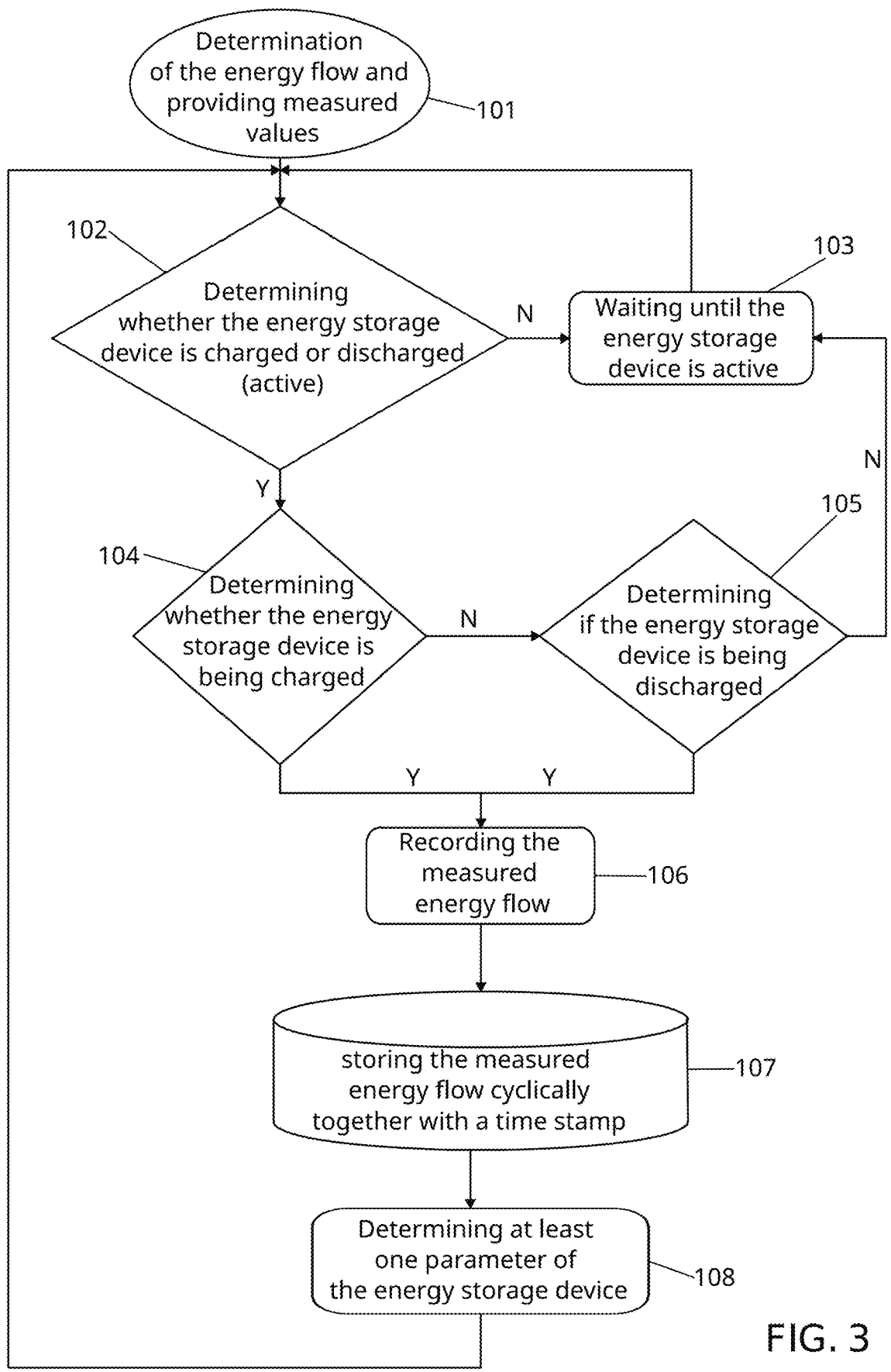
FIG. 3 shows a flow diagram of the method according to the invention.

FIG. 3 shows an exemplary flow diagram for the method according to the invention, which is carried out in the evaluation unit 10. The at least one parameter P of the energy storage device is determined by executing the steps 101 to 108. Steps 101 through 108 are executed iteratively. In step 101 the procedure is started. Measured values are provided by continuous determination of the energy flow F. In step 102, the measured values are used to determine whether the energy storage device 2 is being charged or discharged and is therefore active. If the energy storage device 2 is inactive, the procedure first waits (step 103) until the energy storage device 2 is active. If the energy storage device 2 is active, in step 104 it is determined whether the energy storage device 2 is being charged. If this is not the case, it is determined if the energy storage device 2 is being discharged (step 105). If the energy storage device 2 is being charged or discharged, the measured energy flow F is recorded in step 106 and stored cyclically together with a time stamp (represented by block 107 which represents a data storage device). In step 108, the at least one parameter P of the energy storage device 2 is determined as described above. The procedure then starts again from step 101 in order to keep the at least one parameter P of the energy storage device 2 up to date. On the basis of this stored energy flow, for example, a representation according to FIG. 2 can be produced.

Preferably, only measured values of the energy flow are stored or used to determine the at least one parameter when the energy storage device 2 is active. As a result, the evaluation or the representation (see FIG. 2) contains no or only short constant lines of energy E, so that a meaningful representation with rising and falling lines results. An energy flow F of one or more energy sources 5 can also be taken into account.

What is claimed is:

1. A method for analyzing an electrical energy storage device without data exchange with the electrical energy storage device, which electrical energy storage device is an accumulator or a battery,
    wherein the electrical energy storage device is included in an electrical energy supply system of a household or a company and electrically connected to at least one consumer and to at least one electrical energy source;
    wherein an electrical energy flow into or out of the electrical energy storage device is directly or indirectly measured using a measuring unit, wherein for measuring the energy flow, an electrical current into and out of the electrical energy storage device and an electrical voltage at the electrical energy storage device are measured;
    wherein the energy flow is expressed by the unit energy per time, and a temporal energy profile of the energy currently contained in the electrical energy storage device is determined from the energy flow by integrating said energy flow over time;
    wherein a usable capacity of the electrical energy storage device and an energy currently contained in the electrical energy storage device are iteratively determined on the basis of the temporal energy profile;
    wherein the usable capacity of the electrical energy storage device and the energy currently contained in the electrical energy storage device are updated on the basis of previously recorded and newly measured values of the energy flow;
    wherein measurements of the energy flow are carried out at regular time-discrete intervals:
    wherein the usable capacity of the electrical energy storage device and the energy currently contained in the electrical energy storage device are updated after each new measurement of the energy flow:
    wherein the usable capacity is the maximum quantity of energy that can actually be used for charging and discharging purposes, and
    wherein the usable capacity of the electrical energy storage device and the energy currently contained in the electrical energy storage device are unknown before carrying out the method for analyzing the electrical energy storage device.

2. The method according to claim 1, wherein the measuring unit is a smart meter.

3. The method according to claim 1, wherein on the basis of the energy currently contained in the electrical energy storage device and the usable capacity of the electrical energy storage device, a current state of charge of the electrical energy storage device is determined.

4. The method according to claim 1, wherein on the basis of the temporal energy profile, a current minimum available capacity of the electrical energy storage device is determined.

5. The method according to claim 4, wherein the current minimum available capacity is a minimum available charging capacity or a minimum available discharging capacity.

6. The method according to claim 1, wherein the at least one electrical energy source feeds electrical energy into the electrical energy storage device as a function of the energy currently contained in the electrical energy storage device or the usable capacity.

7. The method according to claim 1, wherein the at least one electrical energy source is an electrical supply network or a photovoltaic system.

8. The method according to claim 7, wherein the electrical supply network is an alternating current network.

9. The method according to claim 1, wherein an energy flow into or out of the at least one electrical energy source is measured.

10. The method according to claim 9, wherein the measured energy flow into or out of the at least one electrical energy source is used to determine the energy currently contained in the electrical energy storage device or the usable capacity.

11. An electrical analysis system for analyzing an electrical energy storage device without data exchange with the electrical energy storage device, which electrical energy storage device is included into an electrical energy supply system of a household or a company, the electrical analysis system comprising:
   at least one measuring unit for detecting an electrical energy flow into or out of the electrical energy storage device, which electrical energy storage device is an accumulator or a battery, wherein said measuring unit is configured to directly or indirectly measure the electrical energy flow into or out of the electrical energy storage device by measuring a current into and out of the electrical energy storage device and an electrical voltage at the electrical energy storage device, wherein said measuring unit is configured to carry out measurements at regular time-discrete intervals;
   an evaluation unit which is configured to iteratively determine an unknown usable capacity of the electrical energy storage device and an unknown energy currently contained in the electrical energy storage device on the basis of a temporal energy profile of the energy currently contained in the electrical energy storage device;
   wherein the usable capacity is the maximum quantity of energy that can actually be used for charging and discharging purposes;
   wherein the energy flow is expressed by the unit energy per time; and
   wherein the evaluation unit is further configured to determine the temporal energy profile from the energy flow and to update the usable capacity of the electrical energy storage device and the energy currently contained in the electrical energy storage device on the basis of previously recorded and newly measured values of the energy flow after each new measurement of the energy flow.

12. An energy supply system, comprising:
   at least one electrical consumer;
   at least one electrical energy source;
   the electrical analysis system for analyzing an electrical energy storage device according to claim 11, and
   the electrical energy storage device,
   wherein the electrical consumer, the at least one electrical energy source, the electrical energy storage device and the at least one measuring unit of the electrical analysis system are electrically connected to one another and the measuring unit is configured to detect the energy flow into and/or out of the electrical energy storage device.

* * * * *